US012120812B2

(12) United States Patent
Wei et al.

(10) Patent No.: US 12,120,812 B2
(45) Date of Patent: Oct. 15, 2024

(54) CIRCUIT BOARD AND METHOD OF MANUFACTURING THEREOF

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei (TW)

(72) Inventors: Hao-Yi Wei, Hebei Province (CN); Childe Zhu, Hebei Province (CN); Yan-Lu Li, Hebei Province (CN)

(73) Assignees: HongQiSheng Precision Electronics (QinHuangdao) Co., Ltd, Qinhuangdao (CN); Avary Holding (Shenzhen) Co., Ltd., Shenzhen (CN); Garuda Technology Co., Ltd., New Taipei (TW)

( * ) Notice: Subject to any disclaimer, the term of this patent is extended or adjusted under 35 U.S.C. 154(b) by 406 days.

(21) Appl. No.: 17/564,941

(22) Filed: Dec. 29, 2021

(65) Prior Publication Data

US 2023/0171877 A1 Jun. 1, 2023

(30) Foreign Application Priority Data

Nov. 30, 2021 (CN) .......................... 202111448291.7

(51) Int. Cl.
*H01P 3/00* (2006.01)
*H01P 3/02* (2006.01)
(Continued)

(52) U.S. Cl.
CPC ........... *H05K 1/0242* (2013.01); *H01P 3/003* (2013.01); *H01P 3/026* (2013.01); *H05K 1/0215* (2013.01); *H05K 3/10* (2013.01)

(58) Field of Classification Search
CPC .......... H01P 3/003; H01P 3/006; H01P 3/026; H01P 3/00; H01P 3/02; H05K 1/0215;
(Continued)

(56) References Cited

U.S. PATENT DOCUMENTS

2004/0113727 A1* 6/2004 Kawai ..................... H01P 1/127
335/78
2005/0168304 A1* 8/2005 Yamaguchi ............. H01P 3/088
333/246
2014/0361854 A1* 12/2014 Kim ..................... H05K 1/0237
333/238

FOREIGN PATENT DOCUMENTS

CN 105792501 B 10/2018
CN 111034376 A 4/2020
WO WO2018147355 A1 8/2018

* cited by examiner

*Primary Examiner* — Timothy J Thompson
*Assistant Examiner* — Guillermo J Egoavil
(74) *Attorney, Agent, or Firm* — Muncy, Geissler, Olds & Lowe, P.C.

(57) ABSTRACT

A circuit board includes a dielectric substrate, a signal line and a pair of ground wires. The dielectric substrate includes a base and an elevated platform protruding from an upper surface of the base. The signal line is conformally disposed on the dielectric substrate and includes a first segment disposed on an upper surface of the elevated platform, a second segment extending on the upper surface of the base, and a third segment disposed on a sidewall of the elevated platform and connecting the first segment and the second segment. The pair of ground wires are disposed on the dielectric substrate and are spaced apart from the signal line. A projection of the second segment of the signal line on the upper surface of the base partly overlaps projections of the pair of ground wires on the upper surface of the base.

12 Claims, 9 Drawing Sheets

(51) Int. Cl.
*H05K 1/02* (2006.01)
*H05K 3/10* (2006.01)

(58) Field of Classification Search
CPC .... H05K 1/0221; H05K 1/024; H05K 1/0242; H05K 1/02; H05K 2201/09045; H05K 3/10; H05K 3/4697
USPC ........................................................ 174/107
See application file for complete search history.

CIRCUIT BOARD AND METHOD OF MANUFACTURING THEREOF

CROSS-REFERENCE TO RELATED APPLICATION

This application claims priority to China Application Serial Number 202111448291.7, filed Nov. 30, 2021, which is herein incorporated by reference in its entirety.

BACKGROUND

Field of Invention

The present application relates to a circuit board and a method of manufacturing thereof, and particularly to a circuit board with a signal line and a method of manufacturing thereof.

Description of Related Art

The frequency used in data communications has been increased as the data communications has been developed rapidly. Due to the facts of losses of transmission, radiation and coupling, it is difficult for a signal line in a circuit board to meet requirement of transmitting high-frequency signal. Therefore, optimizing structures of the signal line in the circuit board has been widely studied for better performance of signal transmission.

SUMMARY

An aspect of the present application provides a circuit board. The circuit board includes a first dielectric substrate, a signal line and a pair of ground wires. The first dielectric substrate includes a base and an elevated platform protruding from an upper surface of the base. The signal line is conformally disposed on the first dielectric substrate and includes a first segment disposed on an upper surface of the elevated platform, a second segment extending on the upper surface of the base, and a third segment disposed on a sidewall of the elevated platform and connecting the first segment and the second segment. The pair of ground wires are disposed on the first dielectric substrate and include a first ground wire and a second ground wire. The first ground wire and the second ground wire are separately positioned by and spaced apart from the signal line. A projection of the second segment of the signal line on the upper surface of the base partly overlaps projections of the pair of ground wires on the upper surface of the base.

An aspect of the present application provides a method of manufacturing a circuit board. The method of manufacturing the circuit board includes providing a first dielectric substrate and forming multiple first recesses in the first dielectric substrate. The first dielectric substrate includes a base, a first elevated platform and multiple second elevated platforms. The first elevated platform and the second elevated platforms protrude from the base and are spaced apart from each other by the first recesses. The base is exposed in the first recesses. The method of manufacturing the circuit board includes forming a signal line on the base and the first elevated platform, providing a second dielectric substrate, forming a second recess in the second dielectric substrate, and bonding the first dielectric substrate and the second dielectric substrate such that the first recesses and the second recess merge to form a space. The signal line is positioned in the space. The method of manufacturing the circuit board includes disposing a pair of ground wires between the first dielectric substrate and the second dielectric substrate such that a first segment of the signal line which is disposed on the first elevated platform is coplanar with the pair of ground wires, and a projection of a second segment of the signal line which is disposed on the base on the first dielectric substrate partly overlaps projections of the pair of ground wires on the first dielectric substrate.

The present application discloses various embodiments to provide a circuit board and a method of manufacturing thereof. A space with air inside can be formed by bonding substrates such that a signal line can extend in the space. Further, a projection of the signal line can partly overlap a projection of ground wire. Thus, the performance of the signal transmission in the circuit board can be enhanced.

It is to be understood that both the foregoing general description and the following detailed description are by examples, and are intended to provide further explanation of the disclosure as claimed.

BRIEF DESCRIPTION OF THE DRAWINGS

Aspects of the present application are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
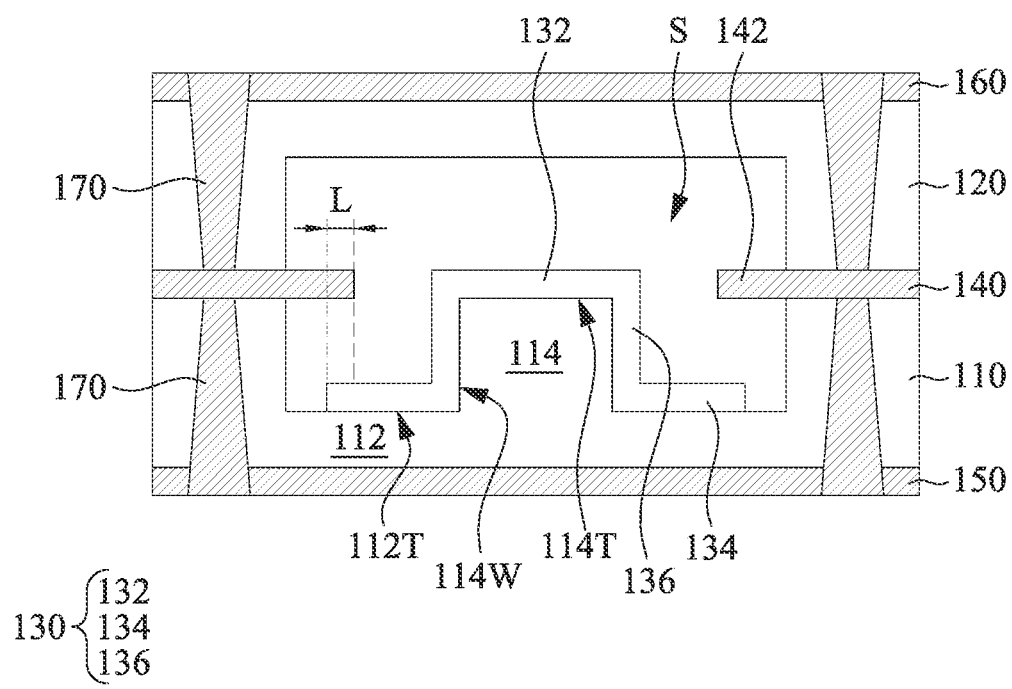
FIG. 1 is a cross-sectional view of an exemplary circuit board according to some embodiments of the present application.

Reference will now be made in detail to the present embodiments of the disclosure, examples of which are illustrated in the accompanying drawings. Wherever possible, the same reference numbers are used in the drawings and the description to refer to the same or like parts.

The following disclosure provides many different embodiments, or examples, for implementing different features of the disclosure. For illustration clarity, many details of practice are explained in the following descriptions. However, it should be understood that these details of practice do not intend to limit the present application. That is, these details of practice are not necessary in parts of embodiments of the present application. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The use of ordinals such as first, second and third does not necessarily imply a ranked sense of order, but rather may only distinguish between multiple instances of an act or structure. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present application.

In some embodiments, the terms "about" and "substantially" can refer to a percentage of the values as interpreted by those skilled in relevant art(s) in light of the teachings herein. The terms "about" and "substantially" can indicate a value of a given quantity that varies within an acceptable deviation of the value. These values are merely examples and are not intended to be limiting.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

The losses of transmission in signal line formed in a circuit board can be an important factor in the efficiency and performance of the circuit board, particularly in high-frequency signal transmitted from one component to another component. In spite of the fact that a transmission length is reduced, an accumulated loss may still cause severe impact. Therefore, a coplanar waveguide (CPW) is introduced and can provide better performance of high-frequency signal transmission than a microstrip line or a stripline can. The structure of the CPW has been optimized to enhance capability of signal transmission. Some embodiments in the present application provides a circuit board including a signal line with CPW structure and a method of manufacturing thereof. With the enhanced CPW structure, the performance of the signal transmission can be boosted.

Referring to FIG. 1, FIG. 1 is a cross-sectional view of a circuit board 100 according to some embodiments of the present application. Specifically, the circuit board 100 illustrated in FIG. 1 includes a signal line with CPW structure.

The circuit board 100 can include a first dielectric substrate 110 and a second dielectric substrate 120. The second dielectric substrate 120 may be disposed on and opposite to the first dielectric substrate 110. The first dielectric substrate 110 may include a base 112 and an elevated platform such as a first elevated platform 114 illustrated in FIG. 1. The first elevated platform 114 protrudes from an upper surface 112T of the base 112 and includes an upper surface 114T and a sidewall 114W. In some embodiments, a space S may exist between the first dielectric substrate 110 and the second dielectric substrate 120.

The circuit board 100 can further include a signal line 130 disposed on the first dielectric substrate 110. In some embodiments, the signal line 130 may be conformally disposed on the first dielectric substrate 110. Particularly, the signal line 130 may include a first segment 132, a second segment 134 and the third segment 136. The first segment 132 is disposed on the upper surface 114T of the first elevated platform 114. The second segment 134 is disposed and extends on the upper surface 112T of the base 112. The third segment 136 is disposed on the sidewall 114W of the first elevated platform 114 and connects the first segment 132 and the second segment 134.

A thickness of the first segment 132, a thickness of the second segment 134 and a thickness of the third segment 136 can substantially be the same, and therefore a thickness of the signal line 130 can substantially be uniform. Further, the signal line 130 can overlie the first dielectric substrate 110 along a profile formed by the base 112 and the first elevated platform 114. As a result, the signal line 130 can be conformally deposited on the first dielectric substrate 110. In addition, in some embodiments, the signal line 130 may directly contact the first dielectric substrate 110.

Generally speaking, an increased line width of the signal line 130 may benefit the performance of the signal transmission by decreasing an impedance of the signal line 130 in the circuit board 100. However, the increased line width may usually lead to an increased size of the circuit board 100. The signal line 130 disclosed in the present application, compared to a planar configuration, can present a vertical configuration by conformally depositing the signal line 130 on the first dielectric substrate 110, and accordingly the line width of the signal line 130 can be increased without the risk associated with the size of the circuit board 100 significantly increased. In some embodiments, the width of the first segment 132 of the signal line 130 may be between about 0.05 mm and 0.1 mm, but the present application is not limited thereto.

In further detail, the signal line 130 of the circuit board 100 may be positioned between the first dielectric substrate 110 and the second dielectric substrate 120. In some embodiments where the space S exists between the first dielectric substrate 110 and the second dielectric substrate 120, the signal line 130 can be deposited within the space S and a portion of the signal line 130 can be surrounded by air which is present within the space S. In other words, the air can be present between the signal line 130 and the second dielectric substrate 120. Therefore, in some embodiments, the signal line 130 may not physically contact the second dielectric substrate 120. Due to the low dielectric properties (such as a low dielectric constant and a low dissipation factor) of the air, the dielectric loss can be reduced by the air around the signal line 130, thereby improving the performance of signal transmission.

The circuit board 100 can further include a pair of ground wires 140 disposed on the first dielectric substrate 110. In some embodiments, a portion of the pair of ground wires 140 may be suspended above the base 112. For example, each of the pair of ground wires 140 includes suspended portions 142 as illustrated in FIG. 1. Each of the pair of ground wires 140 may be separately disposed by two sides of the first segment 132 of the signal line 130 and spaced apart from the first segment 132 of the signal line 130. In some embodiments, each of the pair of ground wires 140 may symmetrically disposed by the two sides of the first segment 132 of the signal line 130. Specifically, one of the pair of ground wires 140 can be a first ground wire (reference number not shown), and the other of the pair of ground wires can be a second ground wire (reference number not shown), as illustrated in FIG. 1. The first ground wire may be positioned at one side of the first segment 132 of the signal line 130, and the second ground wire may be positioned at the other side of the first segment 132 of the signal line 130. That is, the signal line 130 can be disposed between the first ground wire and the second ground wire. Further, the signal line 130 may not be electrically connected to the pair of ground wires 140.

When the first segment 132 of the signal line 130 and the pair of ground wires 140 are coplanar (i.e., a distance between the first segment 132 of the signal line 130 and the base 112 is substantially the same as a distance between the pair of ground wires 140 and the base 112), the signal line 130 and the pair of ground wires 140 may collectively form a coplanar waveguide transmission line.

As discussed previously, the second segment 134 of the signal line 130 may extend on the upper surface 112T of the base 112, and the portion of the pair of ground wires 140 (such as the suspended portions 142) may be suspended above the upper surface 112T of the base 112. In some embodiments, a projection of the second segment 134 on the upper surface 112T of the base 112 may partly overlap projections of the pair of ground wires 140 on the upper surface 112T of the base 112. In other words, the projection of the second segment 134 on the upper surface 112T of the base 112 and the projections of the pair of ground wires 140 on the upper surface 112T of the base 112 may not be thoroughly separate. In FIG. 1, the projection of the second segment 134 on the upper surface 112T of the base 112 and the projection of one of the pair of ground wires 140 on the upper surface 112T of the base 112 can partly overlap with an overlapping length L.

When the circuit board 100 is used to transmit signals, especially high-frequency signals, in which the signal line 130 and the pair of ground wires 140 overlap, a magnetic field can be generated and distributed between the signal line 130 and the pair of ground wires 140. Accordingly, high current density at edges of the signal line 130 can be avoided in this way, and thus the conductor loss of the signal line 130 can be reduced. Therefore, the performance of signal transmission can be enhanced. In additions, the impedance can be adjusted by controlling the overlapping length L between the projection of the signal line 130 and the projection of one of the pair of ground wires 140 impedance so as to obtain a wide impedance range. In some embodiments, a ratio of a total overlapping length between the projection of the second segment 134 of the signal line 130 and the projections of the pair of ground wires 140 to a total length of the signal line 130 may be less than 30%. The total length of the signal line 130 can include a total length of all of the first segment 132, the second segment 134 and the third segment 136. As illustrated in FIG. 1 where each of the pair of ground wires 140 is symmetrically arranged by the two sides of the signal line 130, the total overlapping length between the projection of the second segment 134 of the signal line 130 and the projections of the pair of ground wires 140 can be twice the overlapping length L. In the aforementioned embodiments, the impedance (e.g., characteristic impedance) can range from about 45Ω to about 55Ω, thereby enhancing the performance of signal transmission in the circuit board 100. It is noted that the term "length", such as the total overlapping length, the total length of the signal line 130 and the like, is referred to dimensions illustrated in the cross-sectional view in FIG. 1.

Similarly, in the embodiments where the space S exists between the first dielectric substrate 110 and the second dielectric substrate 120, the suspended portions 142 of the pair of ground wires 140 can be disposed within the space S, and the suspended portions 142 of the pair of ground wires 140 can be surrounded by the air which is present within the space S. Therefore, the air can be present between the signal line 130 and the pair of ground wires 140. In some embodiments, the signal line 130 may not physically contact the pair of ground wires 140. When the circuit board 100 is used to transmit signal, an electrical field can be generated and distributed in an air region between the signal line 130 and the pair of ground wires 140. Due to the low dielectric properties (such as a low dielectric constant and a low dissipation factor) of the air, the dielectric loss can be reduced by the air present between the signal line 130 and the pair of ground wires 140, thereby improving the performance of signal transmission.

As discussed previously, the increased line width of the signal line 130 can reduce the impedance of the signal line 130 and accordingly enhance the performance of signal transmission. However, the increased line width of the signal line 130 may usually result in a larger size of the circuit board 100. The signal line 130 disclosed in the present application can include not only the vertical configuration but also an overlapping configuration where the signal line 130 and the pair of ground wires 140 partly overlap. The vertical and overlapping configurations may ensure the size of circuit board 100 remained or scaled down when the line width of the signal line 130 is increased. Therefore, the signal line 130 can be increased without a risk associated with the size of the circuit board 100 significantly increased.

The circuit board 100 can further include a first ground plane 150 and a second ground plane 160 opposite to the first ground plane 150. The signal line 130 and the pair of ground wires 140 may be positioned between the first ground plane 150 and the second ground plane 160. In some embodiments, the first ground plane 150 can be disposed beneath the first dielectric substrate 110 and cover a lower surface of the first dielectric substrate 110. In some embodiments, the second ground plane 160 can be disposed above the second dielectric substrate 120 and cover an upper surface of the second dielectric substrate 120.

The first ground plane 150 and the second ground plane 160 can be foil layers. In a case where the circuit board 100 is used to transmit signal, the first ground plane 150 and the second ground plane 160 can serve as a shield structure to prevent leakage of electromagnetic waves which are produced by the signal transmission and radiate outwards during signal transmission, thereby improving the performance of signal transmission. Since the first ground plane 150 and the second ground plane 160 can be disposed as the shield structure, the signal line 130 may not be electrically connected to the first ground plane 150 and the second ground plane 160.

The circuit board 100 can further include multiple conductive posts 170 disposed by the two sides of the signal line 130. In some embodiments, the conductive posts 170 may connect the pair of ground wires 140, the first ground plane 150 and the second ground plane 160. In a case where the circuit board 100 is used to transmit signal, the first ground plane 150, the second ground plane 160 and the conductive posts 170 can collectively serve as a shield structure surrounding the signal line 130 to prevent leakage of electromagnetic waves which are produced by the signal transmission and radiate outwards during signal transmission, thereby improving the performance of signal transmission. Since the first ground plane 150, the second ground plane 160 and the conductive posts 170 can be disposed as the shield structure, the signal line 130 may not be electrically connected to the first ground plane 150, the second ground plane 160 and the conductive posts 170.

FIG. 2, FIG. 3, FIG. 4, FIG. 5, FIG. 6A, FIG. 6B, FIG. 6C, FIG. 7, FIG. 8 and FIG. 9 are cross-sectional views at various stages of a method of manufacturing a circuit board according to some embodiments of the present application. Various operations of embodiments are provided herein. The order in which some or all of the operations are described should not be construed to imply that these operations are necessarily order dependent. Alternative ordering will be appreciated having the benefit of this description. Additional operations can be provided before, during, and/or after these operations, and may be briefly described herein. Further, it will be understood that not all operations are necessarily present in each embodiment provided herein. Also, it will be understood that not all operations are necessary in some embodiments.

Figure 2:
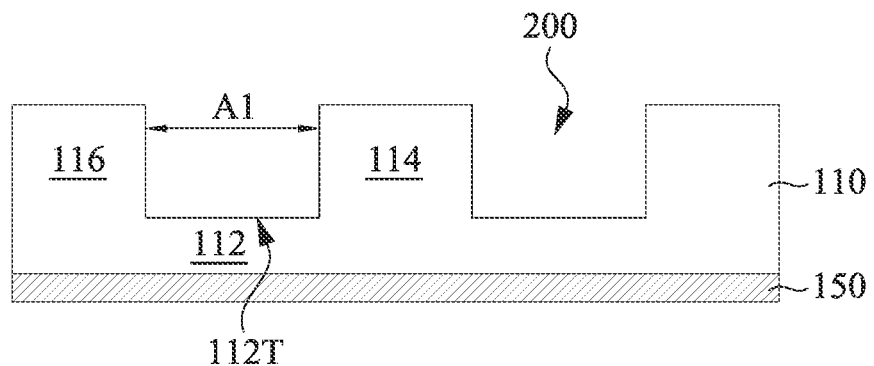
FIG. 2, FIG. 3, FIG. 4, FIG. 5, FIG. 6A, FIG. 6B, FIG. 6C, FIG. 7, FIG. 8 and FIG. 9 are cross-sectional views at various stages of a method of manufacturing a circuit board according to some embodiments of the present application.

Referring to FIG. 2, FIG. 2 illustrates an operation of providing the first dielectric substrate 110. A first foil layer 150 may be firstly disposed on the first dielectric substrate 110. Subsequently, multiple first recesses 200 can be formed in the first dielectric substrate 110. Particularly, the first recesses 200 can be formed in one side of the first dielectric substrate 110 where the first foil layer 150 is not disposed thereon. After the first recesses 200 are formed, the first dielectric substrate 110 may then include the base 112 and elevated platforms. The elevated platforms may include a first elevated platform 114 and multiple second elevated platforms 116. The first elevated platform 114 may be positioned between two of the second elevated platforms 116. The elevated platforms (e.g., the first elevated platform 114 and the second elevated platforms 116) may protrude from the upper surface 112T of the base 112.

The first elevated platform 114 and the second elevated platforms 116 can be spaced apart from the first recesses 200, and a portion of the upper surface 112T of the base 112 may be exposed in the first recesses 200. The portion of the upper surface 112T of the base 112 exposed in the first recesses 200 may include an area A1. In other words, an arrangement of the first elevated platform 114 and the second elevated platforms 116 can be determined by the first recesses 200.

The first dielectric substrate 110 can be made of polyimide (PI), polyethylene terephthalate (PET), polyethylene naphthalate (PEN), polyurethane (PU), polyethylene (PE), polytetrafluoroethylene (PTFE), liquid crystal polymer (LCP), polyvinyl chloride (PVC), other suitable materials, or a combination of thereof. For instance, the first dielectric substrate 110 can be made of LCP. In some embodiments, the first dielectric substrate 110 can be made of any materials with dielectric constant lower than about 3.9 to reduce the dielectric loss.

The first foil layer 150 can be made of gold (Au), silver (Ag), copper (Cu), other suitable metal, or a combination thereof. In some embodiments, the first foil layer 150 can be a copper foil layer. In some embodiments, the first dielectric substrate 110 can be made of flexible copper clad laminate (FCCL). In some embodiments, the thickness of the first foil layer 150 may be between about 25 μm and about 30 μm. The first recesses 200 can be formed by a laser process, mechanical drill process, an etching process (e.g., wet etching), other suitable processes, or a combination of thereof.

Figure 3:
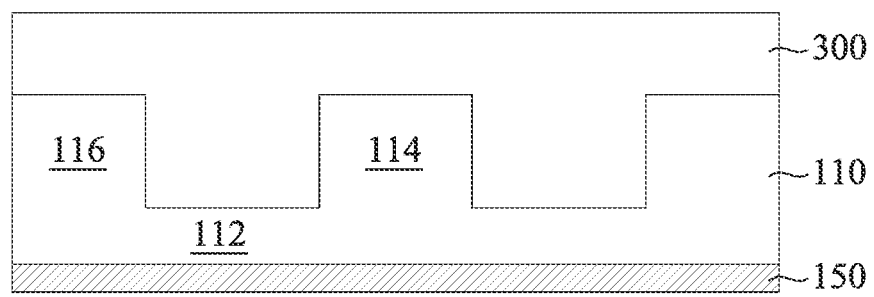
Figure 4:
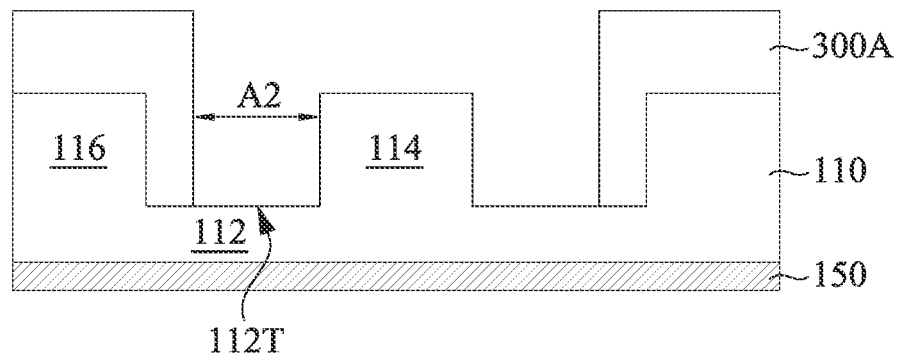
Figure 5:
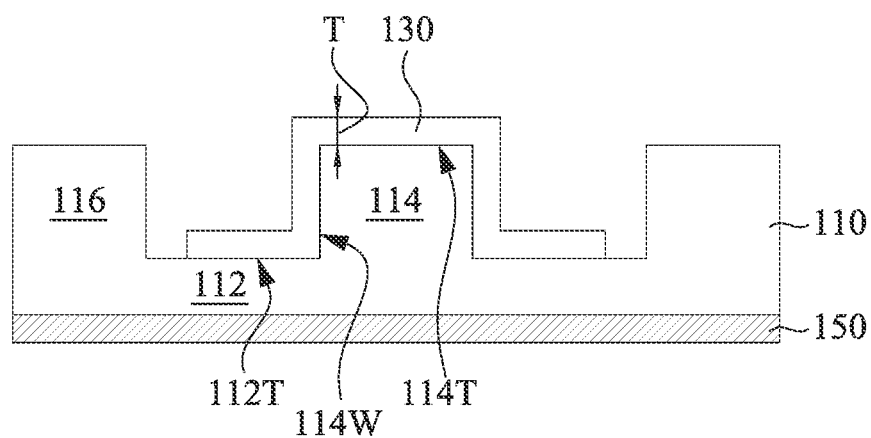

FIG. 3, FIG. 4 and FIG. 5 are cross-sectional views at various stages of a method of manufacturing a circuit board according to some embodiments of the present application, and particularly describe a method of manufacturing the signal line 130 in a circuit board.

Referring to FIG. 3, FIG. 3 illustrates an operation of disposing a first photoresist 300 on the first dielectric substrate 110. The first photoresist 300 may cover the base 112, the first elevated platform 114 and the second elevated platforms 116. In some embodiments, the first recesses 200 (referring to FIG. 2) may be filled with the first photoresist 300.

Referring to FIG. 4, FIG. 4 illustrates an operation of patterning the first photoresist 300 to form a first patterned photoresist 300A. The first patterned photoresist 300A keeps covering the second elevated platforms 116. On the other hand, the first patterned photoresist 300A may not cover the first elevated platform 114 and a portion of the upper surface 112T of the base 112. That is, the first elevated platform 114 and the portion of the upper surface 112T of the base 112 may be exposed after the patterning process. The exposed portion of the upper surface 112T of the base 112 without the first patterned photoresist 300A overlying may include an area A2. It is noted that the area A2 where the base 112 is exposed in FIG. 4 is smaller than the area A1 where the base 112 is exposed in FIG. 2.

Referring to FIG. 5, FIG. 5 illustrates an operation of depositing a material of the signal line 130 on an exposed area without the first patterned photoresist 300A (referring to FIG. 4) overlying to from the signal line 130 on the first dielectric substrate 110. Specifically, a conductive material can be deposited on the upper surface 112T of the base 112, the sidewall 114W of the first elevated platform 114, and the upper surface 114T of the first elevated platform 114. The resulted the signal line 130 does not physically contact the second elevated platforms 116 since the second elevated platforms 116 may be blocked by coverage of the first patterned photoresist 300A (referring to FIG. 4). Therefore, a contact between the signal line 130 and the first dielectric substrate 110 may be restricted, thereby reducing the effect of dielectric loss.

Recesses formed in the first dielectric substrate 110 such as the first recesses 200 in FIG. 2 can be later used to form a space containing the air (e.g., the space S in FIG. 1) and can also determine a profile of the signal line 130. No additional operations may be required for forming or designing the profile of the signal line 130, and thus the process can be simplified and the cost can be reduced. Further, the first dielectric substrate 110 can support the signal line 130.

The deposition process to form the signal line 130 can include an evaporation process, a sputtering process, an electroplating process, other suitable process, a combination thereof. For example, an electroplating process is applied. In some embodiments, the signal line 130 can be conformally deposited on the first dielectric substrate 110 by adjusting the electroplating parameters such as current density. In some embodiments, a thickness T of the signal line 130 may be between about 10 μm and about 20 μm. In some embodiments, the thickness T of the signal line 130 may be about 15 μm. The signal line 130 can include conductive materials. In some embodiments, the signal line 130 can be made of metal such as Au, Ag, Cu, aluminum (Al) and the like. In some embodiments, the signal line 130 can be made of Cu.

In some embodiments, an additional operation of forming a seed layer (not shown herein) on the structure of FIG. 2 may be performed between the operation in FIG. 2 and the operation in FIG. 3. In the embodiments where the deposition process in FIG. 5 is the electroplating process, the seed layer (not shown herein) can facilitate the growth of films in the electroplating process and the quality of the resulted signal line 130. The seed layer can be made of conductive materials, such as carbon (C), Au, Cu, nickel (Ni), Ag, Al and the like.

Figure 6A:
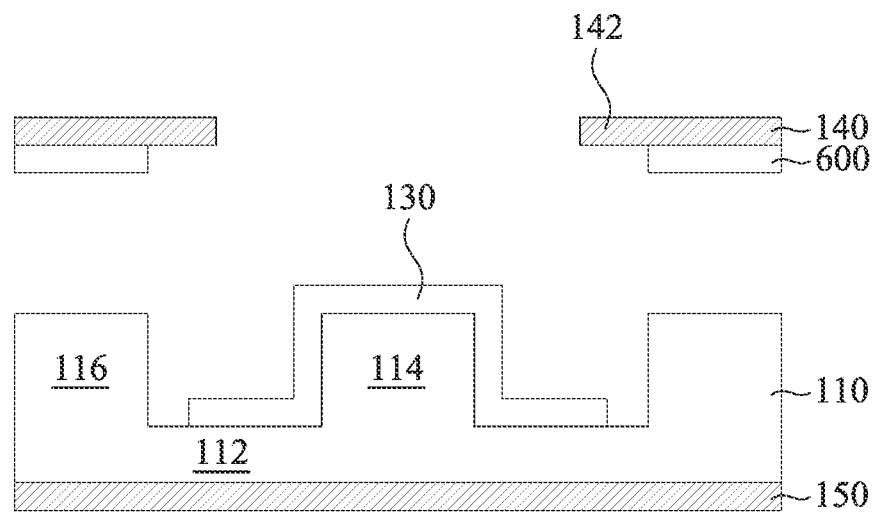
Figure 6B:
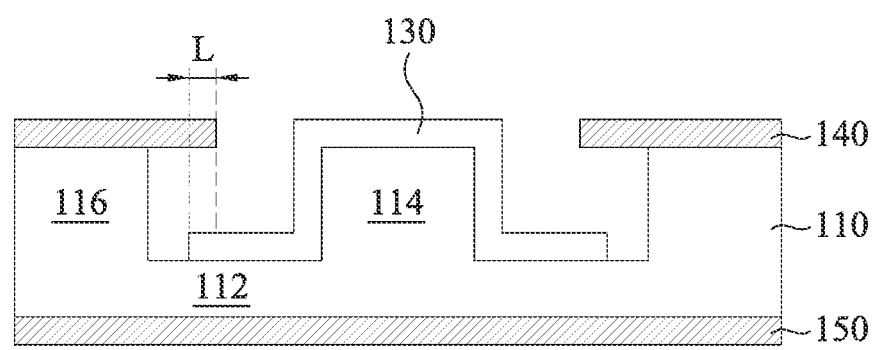
Figure 6C:
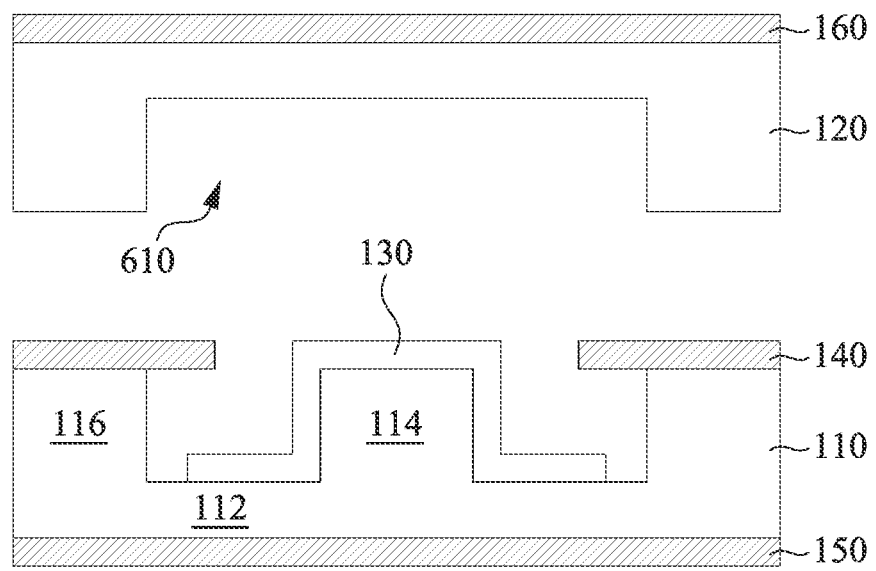

FIG. 6A, FIG. 6B and FIG. 6C are cross-sectional views at various stages of a method of manufacturing a circuit board according to some embodiments of the present application, and particularly describe a method of manufacturing the pair of ground wires 140 disposed between the first dielectric substrate 110 and the second dielectric substrate 120.

Referring to FIG. 6A, FIG. 6A illustrates an operation of providing a third dielectric substrate 600. In order to bond the third dielectric substrate 600 onto the second elevated platforms 116 of the first dielectric substrate 110 in the following FIG. 6B, a structure of the third dielectric substrate 600 can correspond with a structure of the second elevated platforms 116 of the first dielectric substrate 110, for example a consistent width. The pair of ground wires 140 may be disposed on the third dielectric substrate 600. It is noted that the suspended portions 142 of the pair of ground wires 140 may extend beyond edges of the third dielectric substrate 600, as illustrated in FIG. 6A.

Referring to FIG. 6B, FIG. 6B illustrates an operation of bonding the third dielectric substrate 600 and the first dielectric substrate 110 to dispose the pair of ground wires 140 on each of the second elevated platforms 116. In other words, the third dielectric substrate 600 can be combined with the first dielectric substrate 110. In some embodiments, a material included in the third dielectric substrate 600 may be the same as a material included in the first dielectric substrate 110. Therefore, the third dielectric substrate 600 and the first dielectric substrate 110 can be integrally formed into one after the third dielectric substrate 600 and the first dielectric substrate 110 are bonded. For the purpose of clarity, after the bonding operation, the first dielectric substrate 110 can represent a combination of the third dielectric substrate 600 and the first dielectric substrate 110.

In some embodiments, before the third dielectric substrate 600 and the first dielectric substrate 110 are bonded, a height of each of the second elevated platforms 116 may be adjusted to ensure that a first segment of the signal line 130 which is disposed on the first elevated platform 114 is coplanar with the pair of ground wires 140 (e.g., the distance between the first segment of the signal line 130 which is disposed on the first elevated platform 114 and the base 112 is substantially the same as the distance between the pair of ground wires 140 and the base 112). As a result, the signal line 130 and the pair of ground wires 140 may collectively form a coplanar waveguide transmission line.

After the third dielectric substrate 600 and the first dielectric substrate 110 are bonded, the first segment of the signal line 130 which is disposed on the first elevated platform 114 can be coplanar with the pair of ground wires 140. In addition, a projection of a second segment of the signal line 130 which is disposed on the base 112 on the first dielectric substrate 110 can partly overlap projections of the pair of ground wires 140 on the first dielectric substrate 110 (e.g., the overlapping length L). In the embodiments where the projection of the signal line 130 and the projections of the pair of ground wires 140 partly overlap, high current density at the edges of the signal line 130 can be avoided because the magnetic field can be distributed between the signal line 130 and the pair of ground wires 140 during the signal line 130 transmitting signals. Thus, the conductor loss of the signal line 130 can be reduced and the performance of signal transmission can further be enhanced.

In some embodiments, the dielectric materials included in the third dielectric substrate 600 and the first dielectric substrate 110 can be thermoplastic. The dielectric materials included in the third dielectric substrate 600 and the first dielectric substrate 110 can be bonded together by controlling the temperature during the bonding process. Accordingly, adhesive materials may not be required to bond the third dielectric substrate 600 and the first dielectric substrate 110 in such embodiments. For example, the dielectric materials included in the third dielectric substrate 600 and the first dielectric substrate 110 can be LCP. In some other embodiment, the adhesive materials (not shown herein) can be used between the first dielectric substrate 110 and the third dielectric substrate 600 in order to bond the first dielectric substrate 110 and the third dielectric substrate 600. The third dielectric substrate 600 and the first dielectric substrate 110 may not be integrally formed into one in such embodiments.

Referring to FIG. 6C, FIG. 6C illustrates an operation of providing the second dielectric substrate 120 and forming a second recess 610 in the second dielectric substrate 120. A second foil layer 160 may be firstly disposed on the second dielectric substrate 120. Subsequently, the second recess 610 can be formed in the second dielectric substrate 120. Particularly, the second recess 610 can be formed in one side of the second dielectric substrate 120 where the second foil layer 160 is not disposed thereon.

The second dielectric substrate 120 can be made of polyimide (PI), polyethylene terephthalate (PET), polyethylene naphthalate (PEN), polyurethane (PU), polyethylene (PE), polytetrafluoroethylene (PTFE), liquid crystal polymer (LCP), polyvinyl chloride (PVC), other suitable materials, or a combination of thereof. For instance, the second dielectric substrate 120 can be made of LCP. In some embodiments, the second dielectric substrate 120 can be made of any material with dielectric constant lower than about 3.9 to reduce the dielectric loss.

The second foil layer 160 can be made of gold (Au), silver (Ag), copper (Cu), other suitable metal, or a combination thereof. In some embodiments, the second foil layer 160 can be a copper foil layer. In some embodiments, the second dielectric substrate 120 can be made of flexible copper clad laminate (FCCL). In some embodiments, a thickness of the second foil layer 160 may be between about 25 μm and about 30 μm. The second recess 610 can be formed by a laser process, mechanical drill process, an etching process (e.g., wet etching), other suitable processes, or a combination of thereof.

Figure 7:
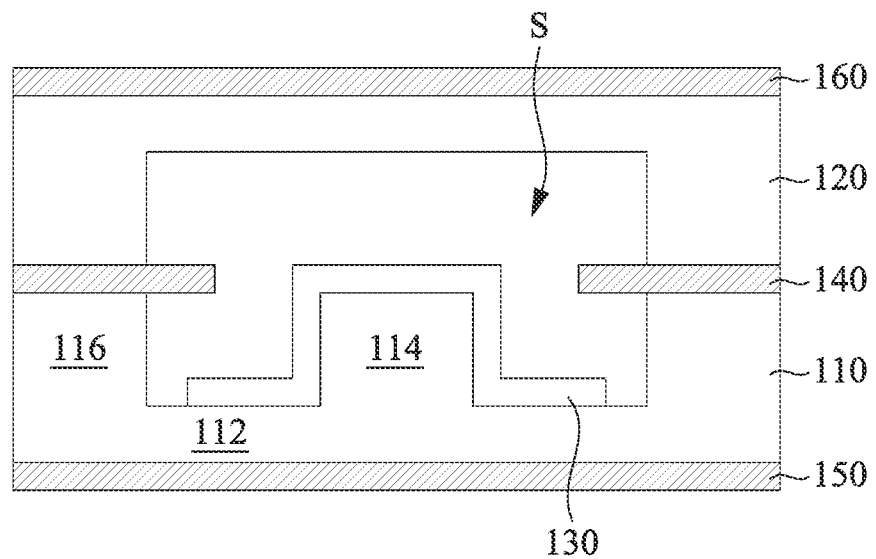

Referring to FIG. 7, FIG. 7 is a cross-sectional view at one of various stages of a method of manufacturing a circuit board according to some embodiments of the present application. FIG. 7 illustrates an operation of bonding the first dielectric substrate 110 and the second dielectric substrate 120 such that the first recesses 200 (referring to FIG. 2) and the second recess 610 (referring to FIG. 6C) merge to collectively form the space S (or cavity). In other words, the space S can be defined by the first recesses 200 (referring to FIG. 2) formed in the first dielectric substrate 110 and the second recess 610 (referring to FIG. 6C) formed in the second dielectric substrate 120. The signal line 130 may be positioned in the space S and surrounded by the air present in the space S. The effect of dielectric loss can be reduced by the air present around the signal line 130 due to the low dielectric properties (such as a low dielectric constant and a low dissipation factor) of the air, thereby improving the performance of signal transmission.

After the first dielectric substrate 110 and the second dielectric substrate 120 are bonded, the signal line 130 is positioned between the first foil layer 150 and the second foil layer 160. Further, the signal line 130 may not be electrically connected to the first foil layer 150 and the second foil layer 160. In some embodiments, the first foil layer 150 and the second foil layer 160 can serve as a first ground plane 150 and a second ground plane 160 respectively to provide a shielding function. Therefore, the leakage of the electromagnetic waves radiating outwards can be reduced during the signal line 130 transmits signal, thereby improving the performance of signal transmission.

Figure 8:
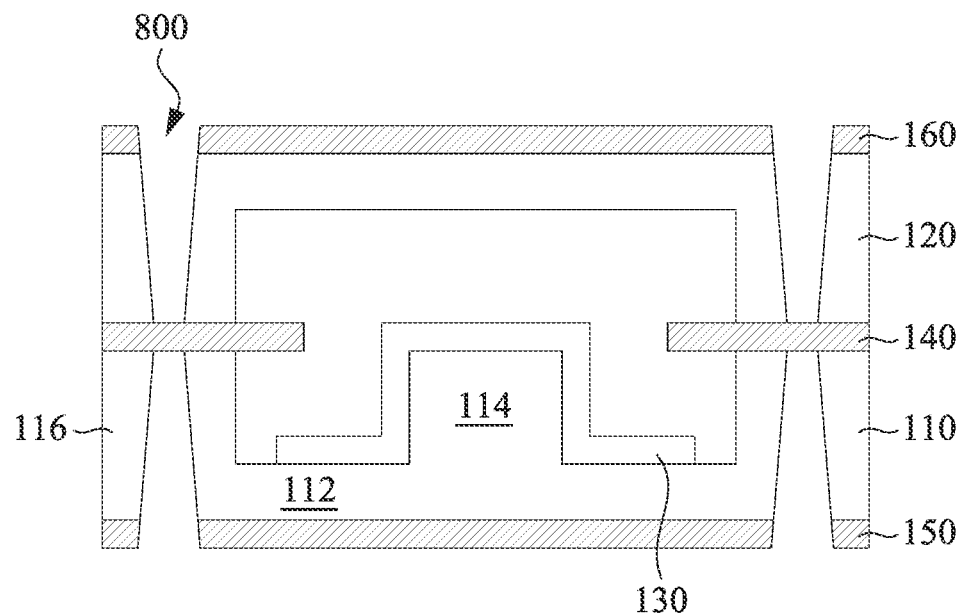

Referring to FIG. 8, FIG. 8 is a cross-sectional view at one of various stages of a method of manufacturing a circuit board according to some embodiments of the present application. FIG. 8 illustrates an operation of forming multiple through holes 800 above and below the pair of ground wires 140 after the first dielectric substrate 110 and the second dielectric substrate 120 are bonded. Particularly, the through holes 800 can be positioned next to two opposite sides of the pair of ground wires 140 and extend through the first dielectric substrate 110, the second dielectric substrate 120, the first foil layer 150 and the second foil layer 160. A formation of the through holes 800 can include a laser process, mechanical drill process, an etching process (e.g., wet etching), other suitable processes, or a combination of thereof.

Figure 9:
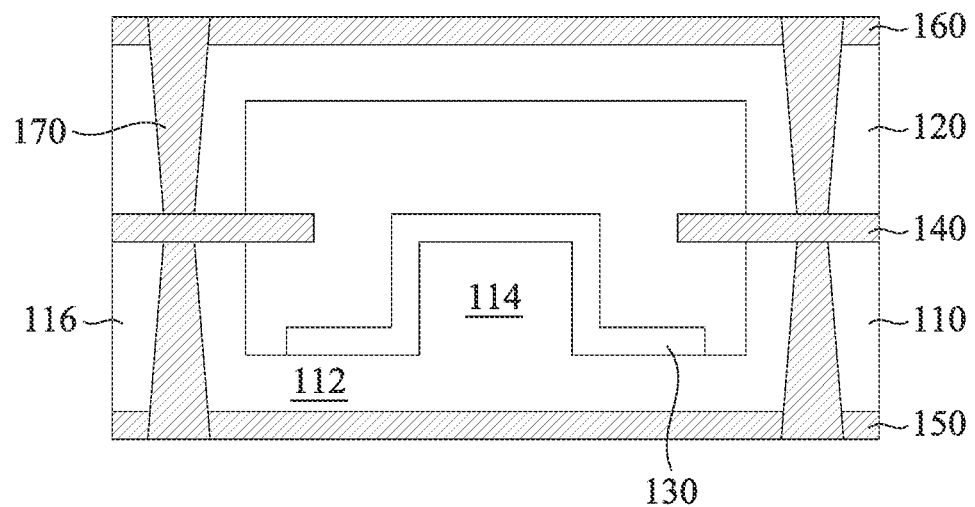

Referring to FIG. 9, FIG. 9 is a cross-sectional view at one of various stages of a method of manufacturing a circuit board according to some embodiments of the present application. FIG. 9 illustrates an operation of deposit conductive materials into the through holes 800 (referring to FIG. 8) to form the conductive posts above and below the pair of ground wires 140. Particularly, the conductive posts 170 can be formed next to the two opposite sides of the pair of ground wires 140. The conductive posts 170 may extend from the pair of ground wires 140 to both the first foil layer 150 and the second foil layer 160 and pass through the first dielectric substrate 110 and the second dielectric substrate 120. Accordingly, the conductive posts 170 can be electrically connected to the pair of ground wires 140, the first foil layer 150 and the second foil layer 160. The deposition process to form the conductive posts 170 can include an evaporation process, a sputtering process, an electroplating process, other suitable process, a combination thereof. For example, an electroplating process can be performed.

In some embodiments, the first foil layer 150, the second foil layer 160 and the conductive posts 170 surround the signal line 130 to provide a shielding function. Therefore, the leakage of the electromagnetic waves radiating outwards can be reduced during the signal line 130 transmits signal, thereby improving the performance of signal transmission. In such embodiments, the signal line 130 may not be electrically connected to the first foil layer 150, the second foil layer 160 and the conductive posts 170.

FIG. 10A to FIG. 10F are cross-sectional views at various stages of a method of manufacturing a circuit board according to some other embodiments of the present application, and particularly describe a method of manufacturing the pair of ground wires 140 disposed between the first dielectric substrate 110 and the second dielectric substrate 120. That is, embodiments described in FIG. 10A to FIG. 10F can correspond with FIG. 6A to FIG. 6C, and the operation described in FIG. 7 can be performed after an operation in FIG. 10F.

Figure 10A:
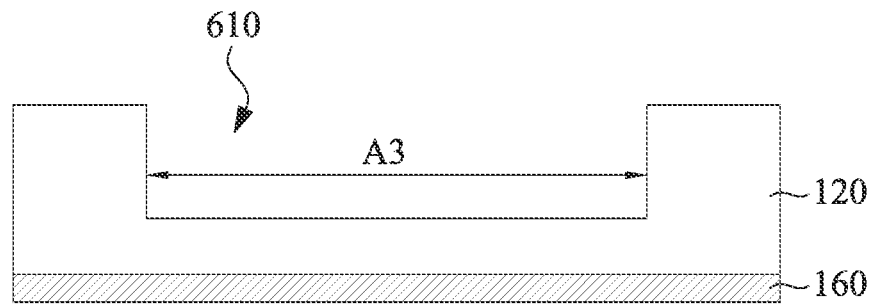
FIG. 10A, FIG. 10B, FIG. 10C, FIG. 10D, FIG. 10E and FIG. 10F are cross-sectional views at various stages of a method of manufacturing a circuit board according to some other embodiments of the present application.

Referring to FIG. 10A, FIG. 10A illustrates an operation of providing the second dielectric substrate 120 and forming the second recess 610 in the second dielectric substrate 120. The second recess 610 may include an area A3. The second foil layer 160 may be firstly disposed on the second dielectric substrate 120.

Figure 10B:
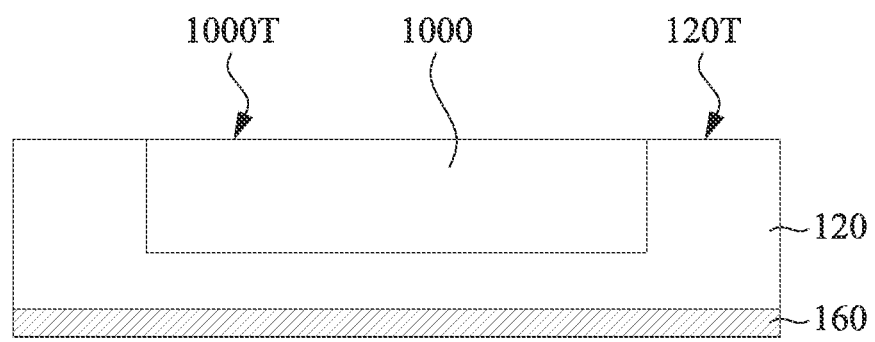
Figure 10C:
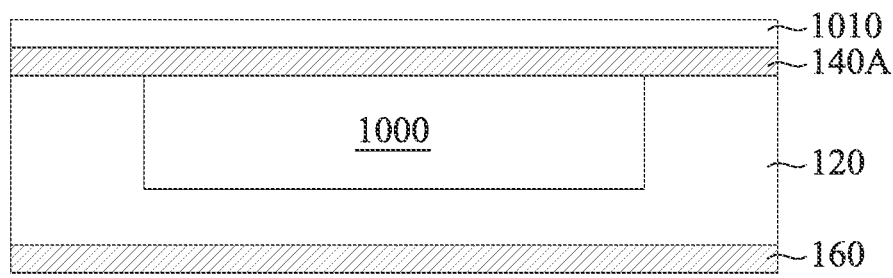

Referring to FIG. 10B, FIG. 10B illustrates an operation of filling the second recess 610 (referring to FIG. 10A) with a second photoresist 1000. An upper surface 1000T of the second photoresist 1000 and the upper surface 120T of the second dielectric substrate 120 are coplanar.

Referring to 100, FIG. 100 illustrates an operation of sequentially forming a metal layer 140A and a third photoresist 1010 on the second photoresist 1000 and the second dielectric substrate 120. For example, the metal layer 140A may firstly be formed on the second photoresist 1000 and the second dielectric substrate 120, and then the third photoresist 1010 may be formed on the above-mentioned metal layer 140A. In some embodiments, the third photoresist 1010 may overlie the metal layer 140A. The metal layer 140A can substantially be a former stage of the pair of ground wires 140, so the metal layer 140A and the pair of ground wires 140 can include the same materials.

Figure 10D:
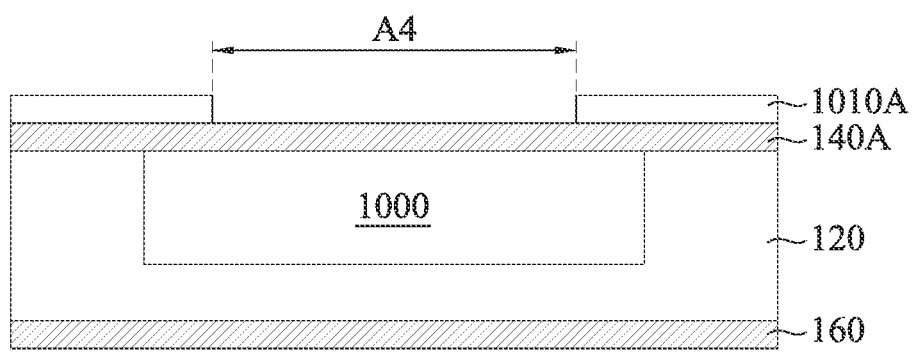

Referring to FIG. 10D, FIG. 10D illustrates an operation of patterning the third photoresist 1010 to form a third patterned photoresist 1010A. The third patterned photoresist 1010A may expose a portion of the metal layer 140A. The exposed portion of the metal layer 140A may include an area A4, which can be smaller than the area A3 of the second recess 610 (referring to FIG. 10A).

Figure 10E:
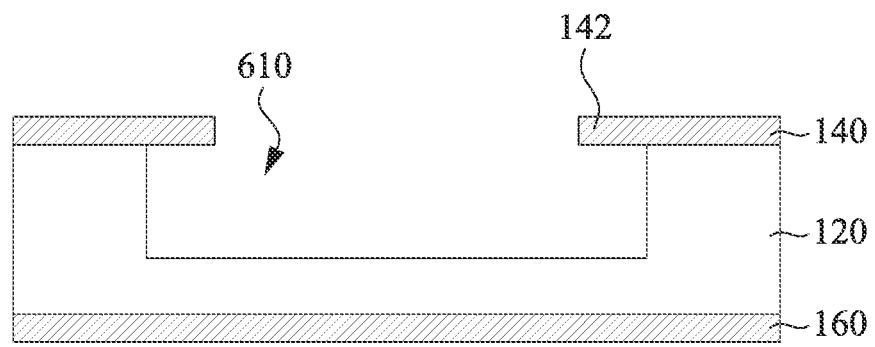

Referring to FIG. 10E, FIG. 10E illustrates an operation of removing the exposed portion of the metal layer 140A within the area A4. The metal layer 140A (referring to FIG. 10D) can be etched through the third patterned photoresist 1010A to form the pair of ground wires 140 on the second dielectric substrate 120.

After the exposed portion of the metal layer 140A (referring to FIG. 10D) are removed to form the pair of ground wires 140, the second photoresist 1000 and the remaining third photoresist (i.e., the third patterned photoresist 1010A) illustrated in FIG. 10D can be removed. The second recess 610 can appear again in the second dielectric substrate 120 after the second photoresist 1000 is removed. Since the area A4 of the exposed portion of the metal layer 140A in FIG. 10D is designed to be smaller than the area A3 of the second recess 610 in FIG. 10A, the resulted pair of ground wires 140 can include some portions (e.g., the suspended portions 142) suspended above the second recess 610. In other words, the suspended portions 142 of the pair of ground wires 140 may not be supported by the second dielectric substrate 120.

Figure 10F:
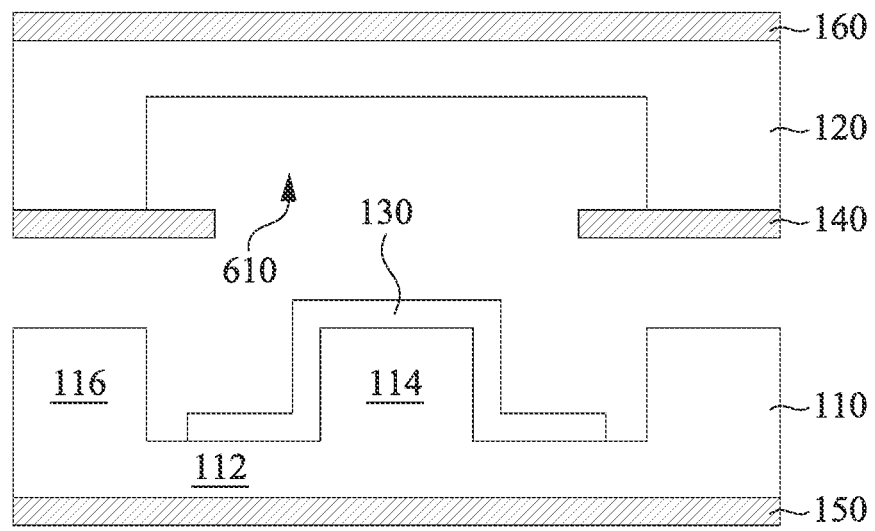

Referring to FIG. 10F, FIG. 10F illustrates an operation of inverting the structure of FIG. 10E to make the second recess 610 face the signal line 130. As a results, the signal line 130 and the pair of ground wires 140 can be disposed between the first dielectric substrate 110 and the second dielectric substrate 120 in the following operation described in FIG. 7. The structure of FIG. 10 can be comparable to the structure in FIG. 6C. A difference between the structure of FIG. 10 and the structure in FIG. 6C is an arrangement of the pair of ground wires 140 before the first dielectric substrate 110 and the second dielectric substrate 120 are bonded (i.e., before the operation described in FIG. 7). After the operation of FIG. 10F, the operation of FIG. 7 can be continued.

It is noted that in the embodiments where the operations described in FIG. 10A to FIG. 10F are performed to manufacture the pair of ground wires 140 on the second dielectric substrate 120, the first elevated platform 114 and the second elevated platforms 116 are coplanar before the first dielectric substrate 110 and the second dielectric substrate 120 are bonded.

The present application discloses various embodiments to provide a circuit board and a method of manufacturing thereof. A space with air inside can be formed by bonding substrates such that a signal line can extend in the space. Further, a projection of the signal line can partly overlap a projection of ground wire. Therefore, the signal line surrounded by the air can lead to a reduced dielectric loss and an overlap between the projection of the signal line and the projection of ground wire can lead to a reduced conductor loss. In addition, a wide impedance range can be obtained by manipulating an overlapping length between the projection of the signal line and the projection of ground wire. Ground planes and conductive posts surrounding the signal line can collective form a shield structure to prevent the leakage of electromagnetic waves radiating outwards during signal transmission. Thus, the performance of the signal transmission in the circuit board can be boosted.

It will be apparent to those skilled in the art that various modifications and variations can be made to the structure of the present application without departing from the scope or spirit of the disclosure. In view of the foregoing, it is intended that the present application cover modifications and variations of this disclosure provided they fall within the scope of the following claims.

What is claimed is:

1. A circuit board, comprising:
   a first dielectric substrate comprising a base and an elevated platform, wherein the elevated platform protrudes from an upper surface of the base;
   a signal line conformally disposed on the first dielectric substrate and comprises:
      a first segment disposed on an upper surface of the elevated platform;
      a second segment extending on the upper surface of the base; and
      a third segment disposed on a sidewall of the elevated platform and connecting the first segment and the second segment; and
   a pair of ground wires disposed on the first dielectric substrate and comprising a first ground wire and a second ground wire, wherein the first ground wire and the second ground wire are separately positioned by and spaced apart from the signal line, and a projection of the second segment of the signal line on the upper surface of the base partly overlaps projections of the pair of ground wires on the upper surface of the base.

2. The circuit board of claim 1, wherein a ratio of a total overlapping length between the projection of the second segment and the projections of the pair of ground wires to a total length of all of the first segment, the second segment and the third segment is less than 30%.

3. The circuit board of claim 1, wherein air is present between the signal line and the pair of ground wires.

4. The circuit board of claim 1, further comprising:
   a second dielectric substrate disposed on the signal line and facing the first dielectric substrate, wherein the signal line is between the first dielectric substrate and the second dielectric substrate, and air is present between the signal line and the second dielectric substrate;
   a first ground plane disposed beneath the first dielectric substrate; and
   a second ground plane disposed above the second dielectric substrate and opposite to the first ground plane, wherein the signal line and the pair of ground wires are positioned between the first ground plane and the second ground plane, and the signal line is not electrically connected to the pair of ground wires, the first ground plane and the second ground plane.

5. The circuit board of claim 4, further comprising:
   a plurality of conductive posts connecting the pair of ground wires, the first ground plane and the second ground plane, wherein the signal line is surrounded by the plurality of conductive posts, the first ground plane and the second ground plane.

6. The circuit board of claim 1, wherein the signal line directly contacts the first dielectric substrate.

7. A method of manufacturing a circuit board, comprising:
   providing a first dielectric substrate;
   forming a plurality of first recesses in the first dielectric substrate such that the first dielectric substrate comprises a base, a first elevated platform and a plurality of second elevated platforms, wherein the first elevated platform and the plurality of second elevated platforms protrude from the base and are spaced apart from each other by the plurality of first recesses, and the base is exposed in the plurality of first recesses;
   forming a signal line on the base and the first elevated platform;
   providing a second dielectric substrate;
   forming a second recess in the second dielectric substrate;
   bonding the first dielectric substrate and the second dielectric substrate such that the plurality of the first recesses and the second recess merge to form a space, wherein the signal line is positioned in the space; and
   disposing a pair of ground wires between the first dielectric substrate and the second dielectric substrate such that a first segment of the signal line which is disposed on the first elevated platform is coplanar with the pair of ground wires, and a projection of a second segment of the signal line which is disposed on the base on the first dielectric substrate partly overlaps projections of the pair of ground wires on the first dielectric substrate.

8. The method of manufacturing the circuit board of claim 7, wherein the forming the signal line comprises:
   disposing a photoresist on the first dielectric substrate;
   patterning the photoresist to expose the first elevated platform and a portion of the base; and
   depositing a material of the signal line.

9. The method of manufacturing the circuit board of claim 7, wherein disposing the pair of ground wires comprises forming the pair of ground wires on the plurality of second elevated platforms of the first dielectric substrate before bonding the first dielectric substrate and the second dielectric substrate.

10. The method of manufacturing the circuit board of claim 7, wherein disposing the pair of ground wires comprises forming the pair of ground wires on the second dielectric substrate before the bonding the first dielectric substrate and the second dielectric substrate.

11. The method of manufacturing the circuit board of claim 10, wherein forming the pair of ground wires on the second dielectric substrate comprises:
   filling the second recess with a second photoresist, wherein an upper surface of the second photoresist and an upper surface of the second dielectric substrate are coplanar;
   forming a metal layer on the second photoresist and the second dielectric substrate;
   disposing a third photoresist on the metal layer;

patterning the third photoresist to expose a portion of the metal layer, wherein an area of the portion is less than an area of the second recess;

removing the portion of the metal layer; and removing the second photoresist and the third photoresist remaining on the metal layer after the removing the portion of the metal layer.

12. The method of manufacturing the circuit board of claim 7, further comprising:

forming a plurality of conductive posts next to two opposite sides of the pair of ground wires after bonding the first dielectric substrate and the second dielectric substrate.

* * * * *